(12) United States Patent
Kwak

(10) Patent No.: US 7,538,488 B2
(45) Date of Patent: May 26, 2009

(54) FLAT PANEL DISPLAY

(75) Inventor: Won-Kyu Kwak, Seongnam-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 712 days.

(21) Appl. No.: 11/050,664

(22) Filed: Feb. 4, 2005

(65) Prior Publication Data

US 2005/0184927 A1    Aug. 25, 2005

(30) Foreign Application Priority Data

Feb. 14, 2004  (KR)  ................ 10-2004-0009843
Feb. 18, 2004  (KR)  ................ 10-2004-0010670

(51) Int. Cl.
*H01J 63/04*    (2006.01)
(52) U.S. Cl. ........................................ 313/506
(58) Field of Classification Search .......... 313/506, 313/512
See application file for complete search history.

(56) References Cited

U.S. PATENT DOCUMENTS 5,231,040 A * 7/1993 Shimura .................. 438/72
5,882,761 A   3/1999 Kawami et al.
6,239,854 B1 * 5/2001 Hirakata et al. ............. 349/149
6,326,936 B1 * 12/2001 Inganas et al. ............... 345/55
6,359,606 B1   3/2002 Yudasaka
2003/0038913 A1 * 2/2003 Choo ........................ 349/149

FOREIGN PATENT DOCUMENTS

CN      1338712       3/2002
JP      2000-173779   6/2000
KR      1020020009498 2/2002

OTHER PUBLICATIONS

*Office action* from the Chinese Patent Office issued in Applicant's corresponding Chinese Patent Application No. 200510064078.0 dated Jun. 20, 2008.

* cited by examiner

*Primary Examiner*—Toan Ton
*Assistant Examiner*—Hana A Sanei
(74) *Attorney, Agent, or Firm*—Robert E. Bushnell, Esq.

(57) ABSTRACT

A display includes: a display area adapted to form an image with display devices arranged on a substrate; a sealing portion adapted to seal at least the display area with a sealant arranged along an outer edge portion of the display area; and a driving power supply line adapted to supply a driving voltage to the display area. The driving power supply line includes at least one conductive layer, at least a portion thereof being arranged between the sealing portion and the substrate. Each conductive layer includes at least one penetration hole.

28 Claims, 10 Drawing Sheets

FLAT PANEL DISPLAY

CLAIM OF PRIORITY

This application makes reference to, incorporates the same herein, and claims all benefits accruing under 35 U.S.C. §119 from an application for FLAT PANEL DISPLAY DEVICE earlier filed in the Korean Intellectual Property Office on Feb. 14, 2004 and Feb. 18, 2004 and there duly assigned Ser. No(s). 2004-9843 and 2004-10670, respectively.

BACKGROUND OF THE INVENTION

1. Field of the Invention

The present invention relates to a display, and more particularly, to a flat panel display having a wide display area at least partially impervious to degradation caused by moisture.

2. Description of the Related Art

Flat panel displays, such as liquid crystal displays, organic electroluminescent displays, and inorganic electroluminescent displays can be classified as either Passive Matrix (PM) displays and Active Matrix (AM) displays according to the driving method thereof. In the PM display, positive electrodes and negative electrodes are arranged in columns and rows, and scanning signals are supplied to the negative electrodes from a row driving circuit. One row is selected. In addition, data signals are converted into pixels by a column driving circuit. In the AM display, signals converted into pixels are controlled by a Thin Film Transistor (TFT). The AM display is suitable for processing an enormous amount of data and for displaying moving pictures.

An organic Electroluminescent (EL) display has an organic light emitting layer of an organic material arranged between an anode and a cathode. In the organic EL display, when a voltage is applied across the electrodes, holes move from the anode through a hole transport layer into an organic light emitting layer, and electrons move through an electron transport layer into the organic light emitting layer. The electrons and holes recombine in the organic light emitting layer to form exitons, and when the exitons dexcite, fluorescent molecules in the organic light emitting layer emit light to form an image. In a full-color organic EL display, pixels for generating Red (R), Green (G), and Blue (B) colors are used to realize full-color.

However, in the organic EL display, organic layers including the organic light emitting layer are very vulnerable to moisture. Thus, in order to protect the organic light emitting layer from moisture and to protect a display area of the display from external shock, the layers are sealed using a substrate or a metal cap.

FIG. 1A is a plan view of an AM organic EL display, and FIG. 1B is a cross-sectional view taken along line I-I of FIG. 1.

The AM organic EL display includes a predetermined area 20 that includes an organic EL device on a transparent base substrate 11, and a metal cap 90 that is sealed by a sealing portion 80 comprising a sealant 81 arranged on the display area 20 so as to seal the display area 20. The display area 20 includes a plurality of pixels, each of which includes the organic EL device having a TFT. In addition, a cathode 40 is arranged on an upper portion of the display area 20, and the cathode 40 is connected to an external terminal area 70 through an electrode routing unit 41 that is arranged on one side of the display area 20. Also, a plurality of driving lines (VDDs) 31 are arranged on the display area 20 and connected to the external terminal area 70 through a driving voltage routing unit 30 arranged on an outer portion of the display area 20. The VDDs supply driving voltage to the display area 20. A vertical circuit unit 50 and a horizontal circuit unit 60, which input signals to the TFT of the display area 20, are further arranged on an outer portion of the display area and are connected to the terminal area 70 through circuit routing units 51 and 62.

In the AM organic EL display described above, the metal cap 90 seals a portion including the display area 20, the routing units 51 and 61, and the circuit units 50 and 60, and excluding only the terminal area 70. Therefore, the sealing portion 80 includes the routing units 51 and 61 and the circuit units 50 and 60 which do not display images, as well as the display area 20 on which images are displayed. Thus, a proportion of the display area 20 that emits light is reduced with respect to the entire size of the display, and accordingly, a dead space, that is, a non-emitting area increases, thereby lowering efficiency.

Moreover, in the organic EL display of FIGS. 1A and 1B, since widths of the routing units 51 and 61 that connect the display area 20 and the terminal area 70 must be thin, the resistance of the routing units is inevitably increased.

The above problem generally occurs in conventional AM type organic EL displays, including the organic EL display of Japanese Laid-Open Patent No. 2000-173779.

On the other hand, U.S. Pat. No. 6,359,606 refers to a technology that forms a protection layer for sealing an entire surface of the display, instead of using a sealing member such as the metal cap or a glass substrate. Thus, the protection layer, instead of the sealing member, protects and preserves the organic EL device by keeping out moisture and oxygen.

However, in the AM display described above, the protection layer is just a thin film, so internal devices are not protected sufficiently. In addition, there is a limit to the protection provided by the protection layer to the organic EL device, which should be protected completely from moisture.

U.S. Pat. No. 5,882,761 refers to a display that further includes a drying substance in the metal cap or glass substrate in order to further protect the organic EL device from moisture. Moreover, the display having the thin protection layer cannot be a front-emission display or a dual-emission display, which form images in a direction of the sealing member.

Korean Laid-open Patent Publication No. 2002-9498 refers to a display in which an EL device is sealed using a covering member and a sealing member including a plurality of wires connected to each other in parallel between the sealing member and the substrate. However, in order to manufacture the display, a plurality of wires having narrow widths must be formed and connected in parallel. Thus, the apparatus has a complex structure and a high line resistance.

SUMMARY OF THE INVENTION

The present invention provides a display, and more particularly, an organic electroluminescent flat panel display, in which a panel (substrate) size is reduced and a sealing function is simultaneously improved.

According to an aspect of the present invention, a display is provided comprising: a display area adapted to form an image with display devices arranged on a substrate; a sealing portion adapted to seal at least the display area with a sealant arranged along an outer edge portion of the display area; and a driving power supply line adapted to supply a driving voltage to the display area; wherein the driving power supply line includes at least one conductive layer having at least a portion thereof arranged between the sealing portion and the substrate, and wherein each conductive layer includes at least one penetration hole.

The at least one conductive layer including the penetration hole preferably comprises a layer of the same material as that of source/drain electrodes arranged on the display area.

The at least one conductive layer including the penetration hole preferably comprises a layer of the same material as that of a gate electrode arranged on the display area.

The display devices preferably comprise organic electroluminescent display devices.

According to another aspect of the present invention, a display is provided comprising: a display area adapted to display an image with display devices arranged on a substrate; a sealing portion adapted to seal the display area with a sealant arranged along an outer edge portion of the display area; and a driving power supply line adapted to supply a driving voltage to the display area; wherein the driving power supply line includes at least one conductive layer having at least a portion thereof arranged between the sealing portion and the substrate and at least one via hole arranged in a protection layer arranged on an upper surface of the driving power supply line contacting the sealant, and wherein the at least one via hole extends so that a portion of the sealant closely contacts an inorganic layer under the protection layer.

The protection layer preferably comprises at least one organic layer.

At least one penetration hole is preferably arranged in the conductive layer between the cross-section and the protection layer.

A position of the at least one penetration hole and a position of the at least one via hole preferably correspond to each other.

A cross-section of the at least one via hole is smaller than that of a corresponding at least one penetration hole.

The conductive layer arranged between the cross-section and the protection layer preferably comprises a layer of the same material as that of source/drain electrodes on the display area.

The conductive layer arranged between the inorganic layer at the bottom of the at least one via hole and the protection layer preferably comprises a layer of the same material as that of a gate electrode on the display area.

The inorganic layer at the bottom of the at least one via hole is preferably of the same material as that of an interlayer on the display area.

The inorganic layer at the bottom of the at least one via hole is preferably of the same material as that of a gate insulating layer on the display area.

The inorganic layer at the bottom of the at least one via hole is preferably of the same material as that of a buffer layer on the display area.

The bottom surface of the at least one via hole preferably contacts a surface of the substrate.

The display devices preferably comprise organic electroluminescent devices.

According to another aspect of the present invention, an organic electroluminescent display is provided comprising: a display area adapted to display an image with organic electroluminescent devices arranged on a substrate; a sealing portion adapted to seal at least the display area with a sealant arranged along an outer edge portion of the display area; and a driving power supply line adapted to supply a driving voltage to the display area; wherein the driving power supply line includes at least one conductive layer, at least a portion thereof being arranged between the sealing portion and the substrate, and wherein at least one penetration hole is formed in a portion of the at least one conductive layer.

According to yet another aspect of the present invention, an organic electroluminescent display is provided comprising: a display area adapted to display an image with organic electroluminescent devices arranged on a substrate; a sealing portion adapted to seal at least the display area with a sealant arranged along an outer edge portion of the display area; and a driving power supply line adapted to supply a driving voltage to the display area; wherein the driving power supply line includes at least one conductive layer, at least a portion thereof being arranged between the sealing portion and the substrate and at least one via hole arranged in a protection layer arranged on an upper surface of the driving power supply line, and wherein the at least one via hole is extended so that a portion of the sealant directly contacts an inorganic layer under the protection layer.

According to still another aspect of the present invention, an organic electroluminescent display is provided comprising: a display area adapted to display an image with organic electroluminescent devices arranged on a substrate; a sealing portion adapted to seal at least the display area with a sealant arranged along an outer edge portion of the display area; and a driving power supply line adapted to supply a driving voltage to the display area; wherein the driving power supply line includes at least one conductive layer, a portion thereof being arranged between the sealing portion and the substrate and at least one via hole arranged in a protection layer arranged on an upper surface of the driving power supply line, and wherein the at least one via hole is extended so that a portion of the sealant directly contacts an inorganic layer under the protection layer, and wherein at least one penetration hole is arranged in the conductive layer arranged between the inorganic layer at the bottom of the at least one via hole and the protection layer.

According to yet another aspect of the present invention, a display is provided comprising: a display area adapted to display an image with organic electroluminescent devices arranged on a substrate; a sealing portion adapted to seal the display area with a sealant arranged along an outer edge portion of the display area; and a driving power supply line adapted to supply a driving voltage to the display area; wherein the driving power supply line includes at least one conductive layer, at least a portion thereof being arranged between the sealing portion and the substrate and at least one penetration hole arranged on at least a portion of the at least one conductive layer, and wherein at least one penetration hole is arranged in a corner of the driving power supply line and extends continuously around the corner.

The at least one conductive layer is preferably arranged in the corner of the driving power supply line and includes at least one layer of the same material as that of source/drain electrodes on the display area.

The at least one conductive layer is preferably arranged in the corner where the at least one penetration hole is arranged and includes at least one layer of the same material as that of a gate electrode on the display area.

According to still another aspect of the present invention, a display is provided comprising: a display area adapted to display an image with display devices arranged on a substrate; a sealing portion adapted to seal the display area with a sealant arranged along an outer edge portion of the display area; and a driving power supply line adapted to supply a driving voltage to the display area; wherein the driving power supply line includes at least one conductive layer, a portion thereof being arranged between the sealing portion and the substrate and at least one via hole arranged in a protection layer arranged on top of the driving power supply line and extending so that a portion of the sealant directly contacts an inorganic layer under the protection layer through the at least one via hole, and wherein at least one via hole is arranged in the protection layer where it overlaps a corner of the sealing portion extending around a corner.

The protection layer preferably comprises at least one organic layer.

At least one penetration hole is preferably arranged around the corner portion of the at least one conductive layer between the inorganic layer at the bottom of the at least one via hole and the protection layer.

A position of the at least one penetration hole in the corner portion of the at least one conductive layer preferably corresponds to a position of the at least one via hole.

A cross-section of the at least one via hole is preferably smaller than that of a corresponding at least one penetration hole.

The at least one conductive layer is preferably arranged between the inorganic layer at the bottom of the at least one via hole and the protection layer and includes a layer of the same material as that of source/drain electrodes on the display area.

The at least one conductive layer is preferably arranged between the inorganic layer at the bottom of the at least one via hole and the protection layer and includes a layer of the same material as that of a gate electrode on the display area.

The inorganic layer at the bottom of the at least one via hole in the corner portion is preferably of the same material as that of an interlayer on the display area.

The inorganic layer at the bottom of the at least one via hole in the corner portion is preferably of the same material as that of a gate insulating layer on the display area.

The inorganic layer at the bottom of the at least one via hole in the corner portion is preferably of the same material as that of a buffer layer on the display area.

The bottom of the at least one via hole in the corner preferably contacts a surface of the substrate.

The display devices preferably comprise organic electroluminescent devices.

According to yet still another aspect of the present invention, a display is provided comprising: a display area adapted to display an image with display devices arranged on a substrate; a sealing portion adapted to seal the display area with a sealant arranged along an outer edge portion of the display area; and a driving power supply line adapted to supply a driving voltage to the display area; wherein the driving power supply line includes at least one conductive layer, a portion thereof being arranged between the sealing portion and the substrate and at least one penetration hole arranged in at least a portion of the at least one conductive layer, and wherein at least one penetration hole is arranged where the at least one conductive layer overlaps the sealing portion transversely with a portion of a neighboring penetration hole arranged toward the display area.

According to another aspect of the present invention, a display is provided comprising: a display area adapted to display an image with display devices arranged on a substrate; a sealing portion adapted to seal the display area with a sealing material arranged along an outer edge portion of the display area; and a driving power supply line adapted to supply a driving voltage to the display area; wherein the driving power supply line includes at least one conductive layer, a portion thereof being arranged between the sealing portion and the substrate and at least one via hole arranged in a protection layer arranged on a top of the driving power supply line and extending so that at least a portion of the sealing material directly contacts an inorganic layer under the protection layer through the at least one via hole, and wherein at least one via hole is arranged in the protection layer where it overlaps the sealing portion transversely with a portion of a neighboring via hole arranged toward the display area.

At least one penetration hole is preferably arranged at a position corresponding to the at least one via hole in a conductive layer arranged between the inorganic layer at the bottom of the at least one via hole, and the protection layer.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1A:
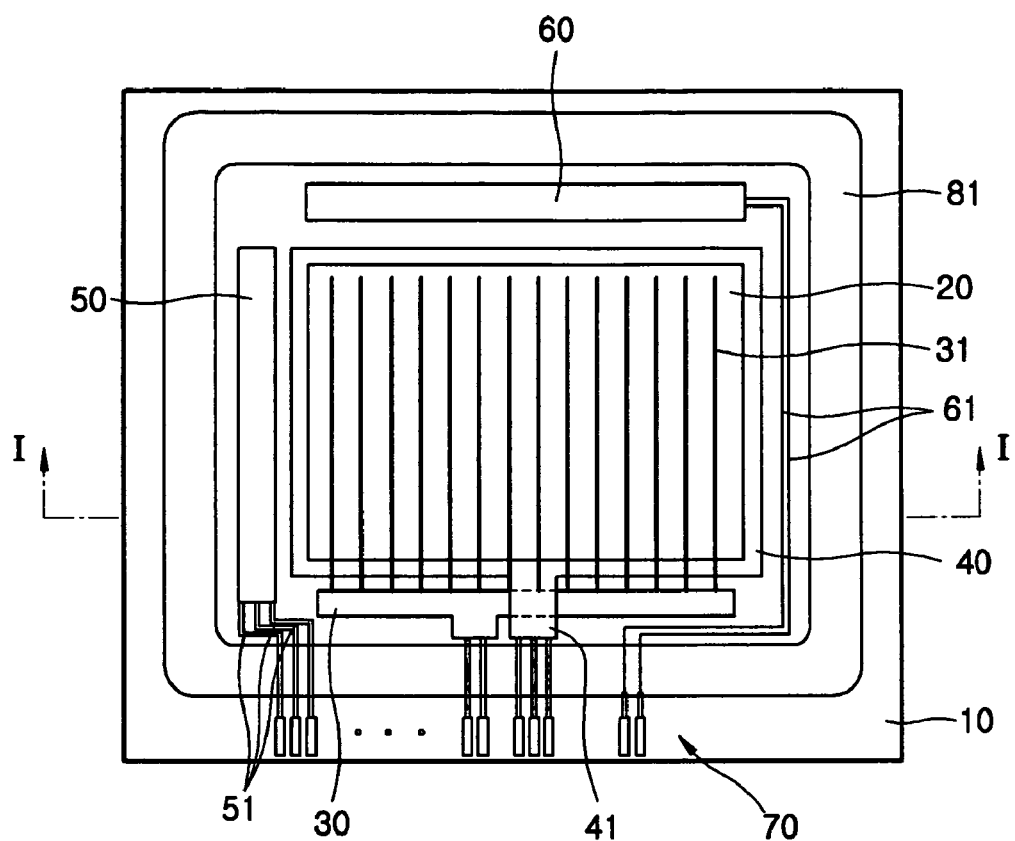
FIG. 1A is a schematic plan view of a conventional flat panel display.
Figure 1B:
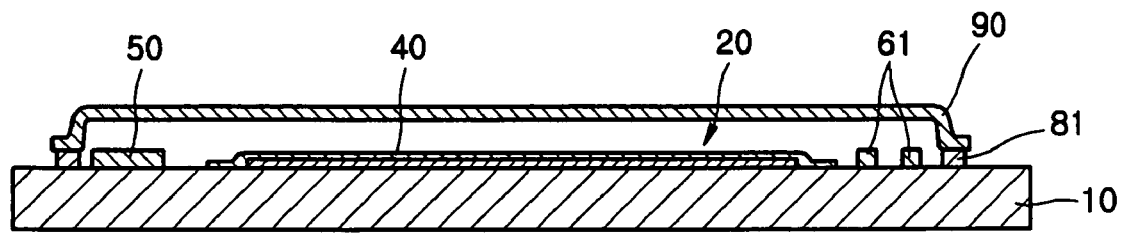
FIG. 1B is a schematic cross-sectional view taken along line I-I of FIG. 1A.
Figure 2A:
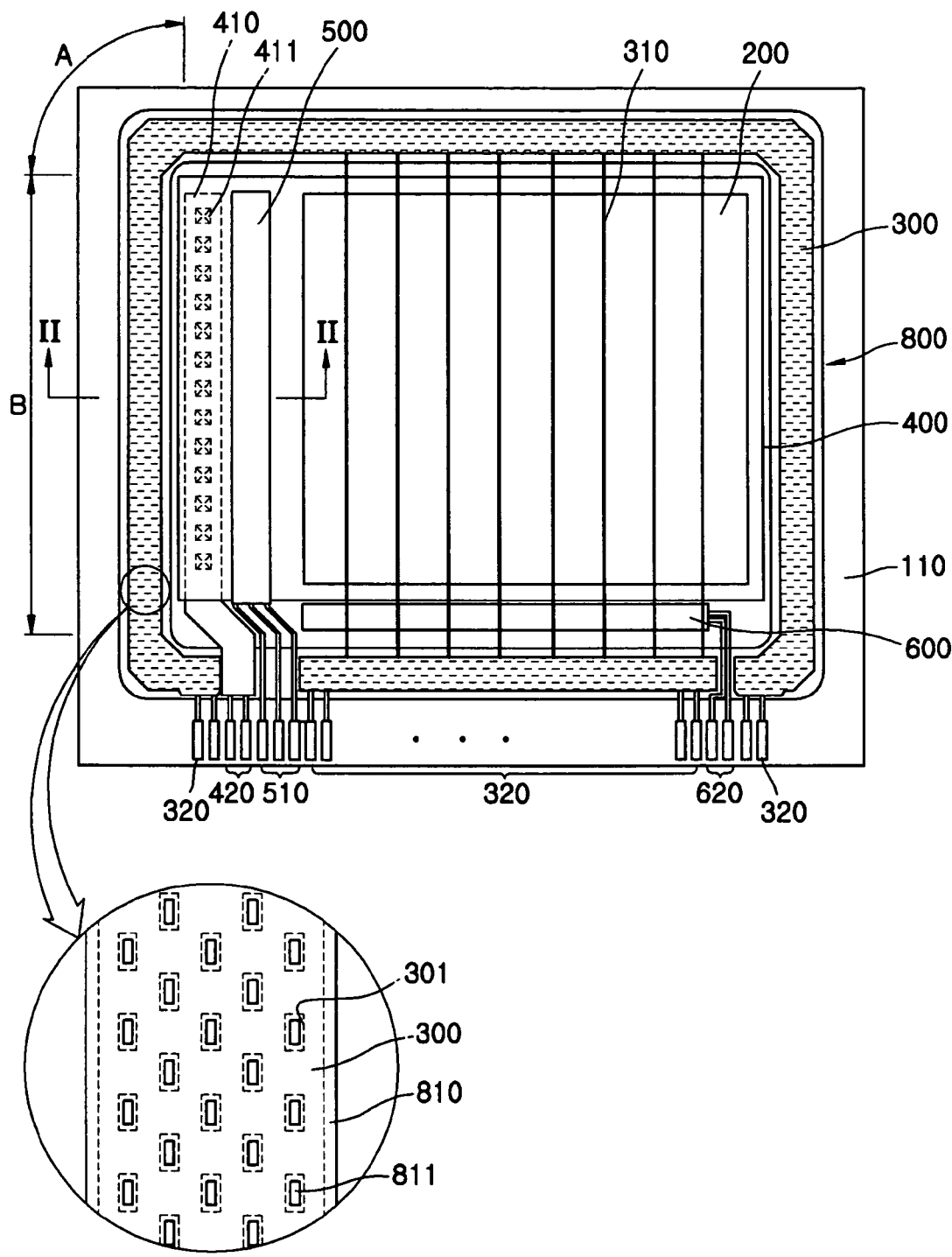
FIG. 2A is a schematic plan view of a flat panel display according to an embodiment of the present invention.

FIG. 2A is a view of a flat panel display, and more specifically, an organic electroluminescent (EL) display, according to an embodiment of the present invention. However, the present invention is not limited to the organic EL display of FIG. 2A.

The organic EL display of FIG. 2A includes a display area 200, on which a light emitting device, such as an organic EL device, is arranged on a substrate 110, a sealing portion 800 applied to an outer edge of the display area 200 to seal the substrate 110 and a sealing substrate (900 in FIG. 2B), and a terminal area, on which various terminals are arranged. The sealing portion 800 includes an edge portion (referred to as B in FIG. 2A) having four sides, and four corner portions (referred to as A in FIG. 2A).

Figure 2B:
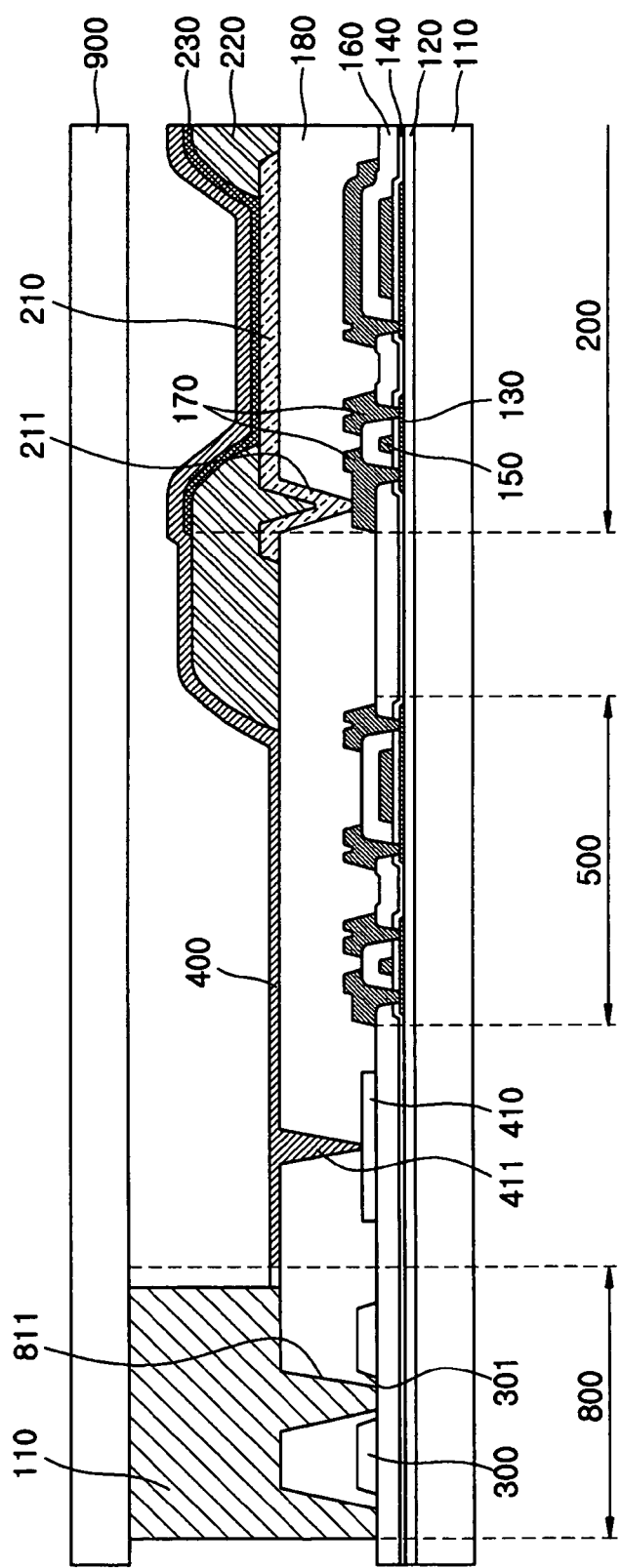
FIG. 2B is a schematic cross-sectional view taken along line II-II of FIG. 2A.

Referring to FIG. 2B, the structure of the organic EL device in the display area 200 will now be described. A buffer layer 120 is formed on a substrate 1 10, for example, a glass substrate using $SiO_2$. A semiconductor active layer 130 comprising an amorphous silicon or polycrystalline silicon is formed on one surface of the buffer layer 120. Although not shown in detail, the semiconductor active layer 130 includes source and drain regions that are doped with N+ type or P+ type impurities, and a channel region.

A gate electrode 150 is formed on an upper portion of the semiconductor active layer 130, and an electric current is supplied to the channel region according to signals applied to the gate electrode 150. In addition, when an electric current is supplied to the channel region, the source and drain regions communicate. The gate electrode 150 is formed of a material, such as MoW, or Al/Cu, considering adherence with a neighboring layer, surface flatness of the layer, and fabrication. In order to insulate the semiconductor active layer 130 from the gate electrode 150, a gate insulating layer 140 of $SiO_2$ is formed between the semiconductor active layer 130 and the gate electrode 150 using a Plasma-Enhanced Chemical Vapor Deposition (PECVD) method.

An interlayer 160, which can be a single layer or a double-layered structure, is formed of a material, such as $SiO_2$ or SiNx, arranged on an upper portion of the gate electrode 150. A source/drain electrode 170 is arranged on an upper portion of the interlayer 160. The source/drain electrode 170 is electrically connected to the source region and the drain region of is the semiconductor active layer through a contact hole formed in the interlayer 160 and the gate insulating layer 140.

A protection layer (a passivation layer and/or planarization layer) 180 is an insulating layer arranged on an upper portion of the source/drain electrode 170 to protect and flatten a Thin Film Transistor (TFT) on a lower portion thereof. The protection layer 180 can be formed of an inorganic material or an organic material, as a single layer structure, a doubled-layered structure consisting of an SiNx lower layer and an organic upper layer such as a benzocyclobutene or acryl upper layer, or a multilayered structure.

A first electrode 210 is arranged on a surface of the protection layer 180, and one end of the first electrode 210 contacts the drain electrode 170 through a via hole 211 formed in the protection layer 180. The first electrode 210 can be a transparent electrode, such as an Indium-Tin-oxide (ITO) electrode, when the organic EL display is a bottom emission display, and can be formed by depositing Al/Ca when the organic EL display is a front emission display.

An organic EL unit 230 can be formed as a small molecular or a high molecular organic film. If a small molecular organic film is used, a Hole Injection Layer (HIL), a Hole Transport Layer (HTL), an Emission Layer (EML), an Electron Transport Layer (ETL), and an Electron Injection Layer (EIL) can be stacked to form a single or multi-layered structure. An organic material such as copper phthalocyanine (CuPc), N,N-di(naphthalene-1-yl)-N,N'-diphenyl-benzidine (NPB), tris-8-hydroxyquinoline aluminum (Alq3) can be used. The small molecular organic layer is formed by a vapor deposition method.

The high molecular organic layer can include an HTL and an EML. A poly-3,4-Ethylenedioxythiophene (PEDOT) is used as the HTL, and a poly-phenylenevinylene (PPV) or polyfluorene-based high molecular organic material can be used as the EML. In addition, the high molecular organic layer is formed by a screen printing or an inkjet printing method.

A cathode electrode 400 is deposited on an upper portion of the organic EL unit 230. However, the method of forming the cathode electrode 400 is not limited to the deposition method. An electrode power supply line 410 is arranged at an outer portion of the display area 200, and a protection layer formed between an end of the cathode electrode 400 and the electrode power supply line 410 is an insulating layer. The end of the cathode electrode 400 and the electrode power supply line 410 can be electrically connected through a via hole 411 (refer to FIG. 2A) formed in the protection layer 400.

Referring to FIG. 2A, a vertical circuit driving unit 500 is arranged between the electrode power supply line 410 and the display area 200, and a horizontal circuit driving unit 600 is arranged on a lower side of the display area 200 in the drawing. However, the driving units 500 and 600 can be arranged in various alternative locations.

A driving power supply line 300 arranged on an outer edge of the display area 200 to supply driving power is connected to a driving line 310, and the driving line 310 crosses the display area 200 and is electrically connected to the source electrode 170 (refer to FIG. 2B) arranged on a lower portion of the protection layer 180.

The electrode power supply line 410, the driving power supply line 300, and the vertical/horizontal circuit driving units 500 and 600 transmit/receive electric signals to/from the outside through an electrode power terminal unit 420, a driving power terminal unit 320, and vertical/horizontal circuit terminal units 510 and 610, respectively.

Referring to FIGS. 2A and 2B, a portion of the driving power supply line 300 is arranged between the sealing portion 800 and the substrate 100 along the sealing portion 700 to reduce a non-display area, that is, a dead space where various wires and driving units are arranged at the outer portion of the display area 200. The outer edge of the driving power supply line 300 that overlaps the sealant 810 of the sealing portion 800 does not extend past the outer edge of the sealant 810.

In FIG. 2B, the driving power supply line 300 is integrally formed when the source/drain electrodes 170 are formed on the display area 200, using the same material. However, the driving power supply line 300 can alternatively be formed as a conductive layer (refer to 300c of FIG. 4A) of the same material as the gate electrode 150, or a conductive layer (refer to 300c of FIG. 4B) can alternatively be formed of the same material as the semiconductor active layer 130.

Also, two or more conductive layers can be arranged to compensate for a voltage drop in the conductive layer. That is, the driving power supply line 300 can include a first conductive layer formed of the same material as the source/drain electrodes 170, and a second conductive layer 300b formed of the same material as the gate electrode 150 (refer to FIG. 4B).

Figure 4A:
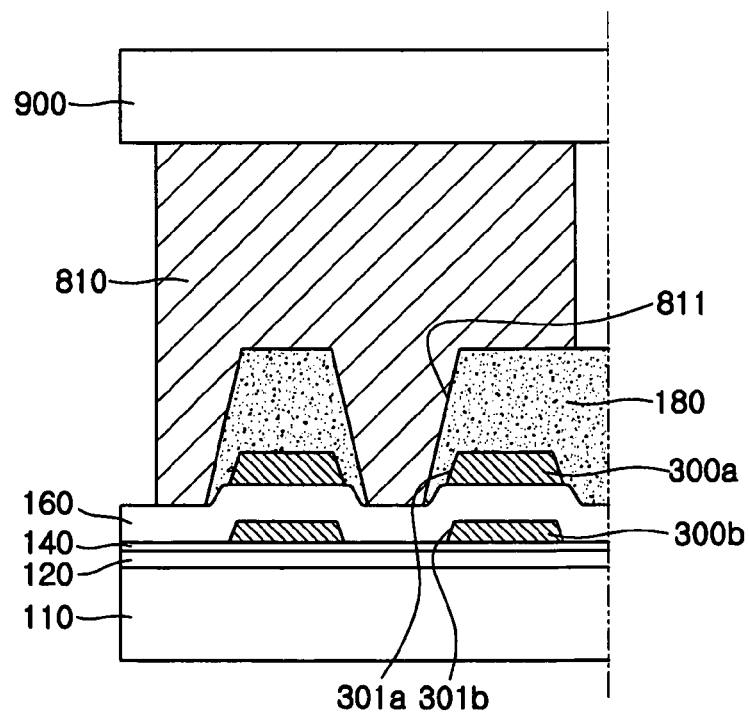
FIGS. 4A through 4C are schematic cross-sectional views of a sealing portion in a flat panel display according to still another embodiment of the present invention.
Figure 4B:
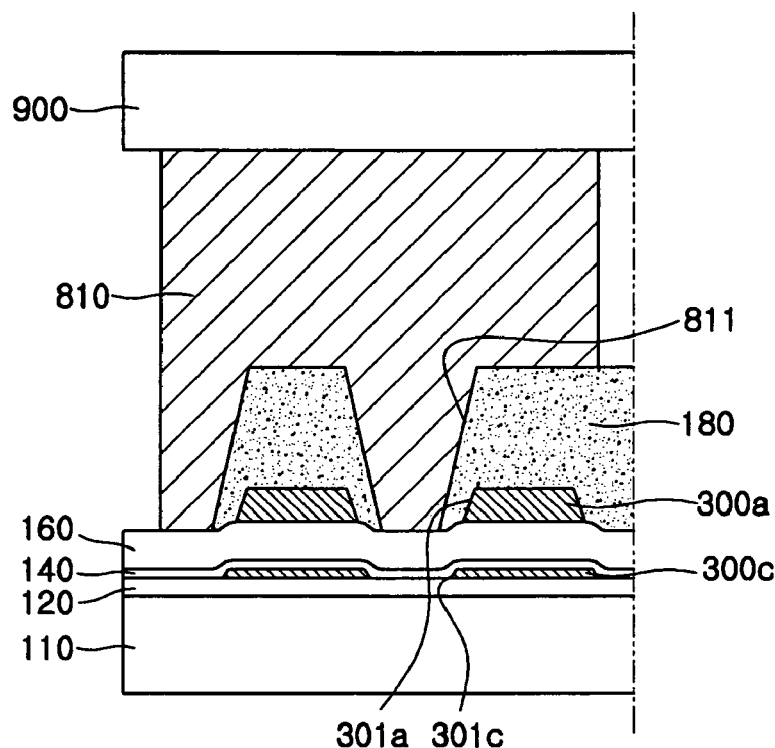
Figure 4C:
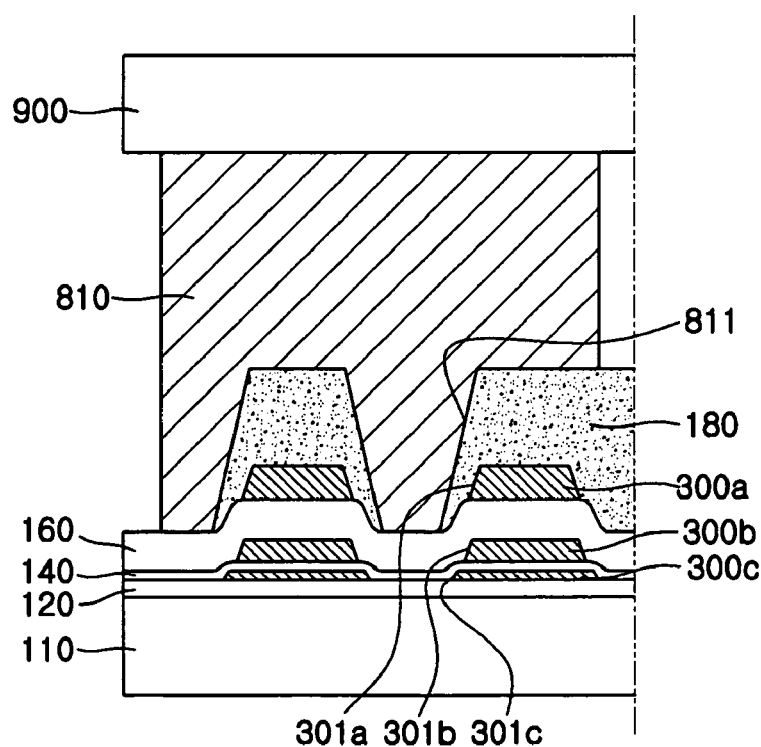

In addition, the driving power supply line 300 can include a first conductive layer 300a formed of the same material as the source/drain electrodes 170, and a third conductive layer 300c formed of the same material as the semiconductor active layer 130 (refer to FIG. 4B), or can include all of the conductive layers (refer to FIG. 4C). That is, the driving power supply line 300 can include one or more conductive layers formed using the same material as the conductive layer formed on the display area 200.

Figure 2C:
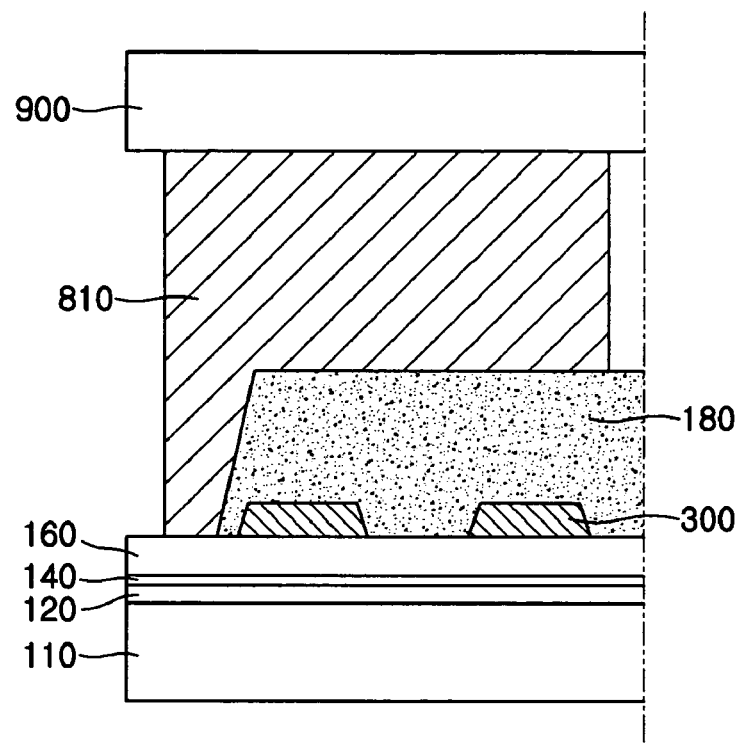
FIG. 2C is a schematic cross-sectional view of the flat panel display of FIG. 2A including a penetration hole.

As shown in FIG. 2C, one or more penetration holes 301 are formed in a portion of the driving power supply line 300, that is, a portion that overlaps the sealing portion 800 to strengthen the seal of the sealing portion 800. For example, when the driving power supply line 300 is fabricated on the display area 200 using the same material as the source/drain electrodes 170, that is, a metal such as MoW, the seal of the sealant 810 can be degraded due to a difference in thermal expansion coefficients between the upper and lower portions of the sealant 810, that is, the glass and the metal layer, when the sealant 810, which is formed of a synthetic material such as an epoxy resin, is cured by exposure to ultraviolet rays. In order to prevent the above problem, the penetration holes 301 can be formed in the driving power supply line 300 as shown in FIG. 2C.

FIG. 2C is a view of a configuration where the sealant 810 is located on an upper portion of the driving power supply line 300. However, the sealant 810 can be applied in other ways. For example, a layer formed of the same material as the first electrode 210 (refer to FIG. 2B) of the display area 200 can be formed on the upper portion of the driving power supply line 300, and the sealant 810 can be applied on that layer. Thus, a chemical reaction between the sealant 810 and the driving power supply line 300 can be prevented, and if the layer has a smaller width than the driving power supply line 300, the contact area with the sealant 810 can be increased and the seal improved.

In FIG. 2C, the driving power supply line 300 is formed on the display area simultaneously with the formation of the source/drain electrodes 170 using the same material as the source/drain electrodes 170. However, the driving power supply line 300 can be formed in other alternative ways. As shown in FIG. 4A, the driving power supply line 300 can include the first conductive layer 300a formed of the same material as the source/drain electrode 170, and the second conductive layer 300b formed of the same material as the gate electrode 150. In addition, the first conductive layer 300a and the second conductive layer 300b can have one or more first penetration holes 301a and one or more second penetration holes 301b, respectively. Also, as shown in FIG. 4B, the driving power supply line 300 can include the first conductive layer 300a formed of the same material as the source/drain electrodes 170 on the display area 200, and the third conductive layer 300c formed of the same material as the semiconductor active layer 130. In addition, the first conductive layer 300a and the third conductive layer 300c have one or more first penetration holes 301a and one or more third penetration holes 301c, respectively. Otherwise, as shown in FIG. 4C, the driving power supply line 300 can include all of the conductive layers 300a, 300b, and 300c, or the second penetration hole 301b and the third penetration hole 301c can be additionally formed although not shown in the drawings. That is, the driving power supply line 300 can include one or more conductive layers, and the conductive layers can have one or more penetration holes on the portion that overlaps the sealing portion 800. When two or more conductive layers are used as the driving power supply line 300, the conductive layers are electrically connected to each other through a contact hole (not shown) to reduce voltage drops.

Figure 5A:
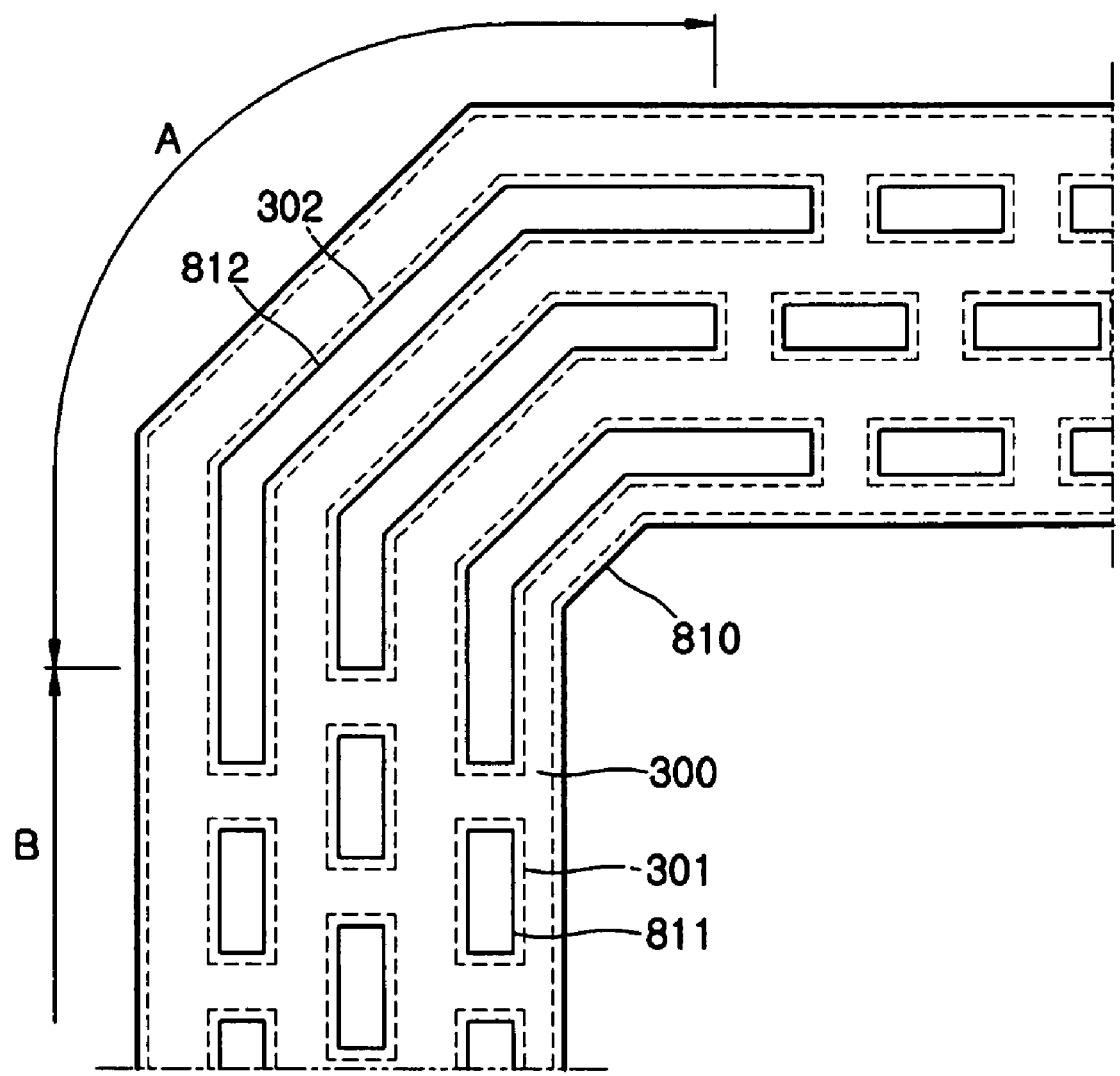
FIG. 5A is a schematic plan view of a corner of a sealing portion according to an embodiment of the present invention.

The penetration hole formed in the driving power supply line 300 according to the present invention can have additional features. That is, the penetration hole formed on the corner A in FIG. 2A can extend around the corner. FIG. 5A is an enlarged view of the corner A in FIG. 2A. As shown in FIG. 5A, the penetration hole 302 in the corner A can be extended as a slit around the corner A, unlike the other penetration holes in the edge portions, and the penetration holes 302 in that corner can be arranged in a plurality of rows. Also, it is desirable for the width of the penetration hole to be reduced when the penetration hole is close to the display area 200 to avoid problems caused when the penetration hole 302 is formed having a long slit shape around the corner.

Figure 2D:
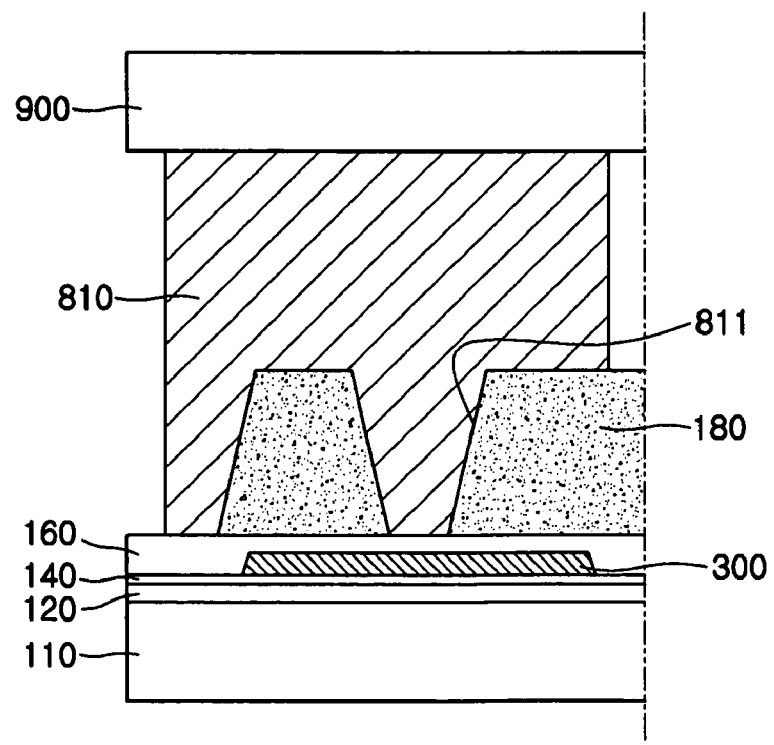
FIG. 2D is a schematic cross-sectional view of the flat panel display of FIG. 2A including a sealant arranged on a via hole of a protection layer according to an embodiment of the present invention.

Referring to FIG. 2D, one or more via holes 811 are arranged on a portion of the protection layer 180 that overlaps the sealing portion 800 to increase the contact area of the sealant 810 with layers stacked on the substrate, thereby tightly sealing the substrate 110 and the encapsulation substrate 900. Also, at the bottom of the via hole 811 is an inorganic layer (interlayer 160 in FIG. 2D) under the protection layer 180, which compensates for any weakness in the adhesion between the sealant 810 composed of a synthetic material, such as an epoxy resin, and the protection layer 180 formed of the organic material, such as an acryl or BCB. In FIG. 2D, the driving power supply line is the layer 300b formed of the same material as the gate electrode 150. However, the present invention is not limited thereto.

The above embodiment that includes the via hole in the portion of the protection layer overlapping the sealing portion can further include the following feature. That is, the via hole formed in the corner (A in FIG. 2A) of the sealing portion 800 that overlaps the protection layer 180 arranged on the upper portion of the driving power supply line 300 can extend around the corner portion A. As shown in FIG. 5A, the via hole 811 in the corner A denoted by the dotted line can be formed as a long slit extending around the corner A, unlike the other via holes on the edge portion. In addition, the via holes at the corner A can be formed in a plurality of rows. It is desirable for the width of the via hole 811 to be reduced when the via hole 811 is close to the display area 200 to avoid problems caused when the via hole 811 is formed as a long slit due to the reduced circumference.

As shown in FIG. 2B, the penetration hole 301 and the via hole 811 can be formed simultaneously on the driving power supply line 300. One or more penetration holes are formed on the conductive layer 300, that is, the driving power supply line 300, arranged between the inorganic layer (interlayer 160 in FIG. 2B) at the bottom of the via hole 811 and the protection layer 180, and the positions of penetration hole 301 and the via hole 811 correspond to each other. When the sealant 810 comprises a synthetic material, such as an epoxy resin, contacts the source/drain electrode material or the gate electrode material, the synthetic material can react with the other materials, thereby damaging the conductive layer, that is, the driving power supply line 300. Thus, it is desirable for the cross-section of the via hole 811 to be smaller than that of the corresponding penetration hole 301.

Figure 3A:
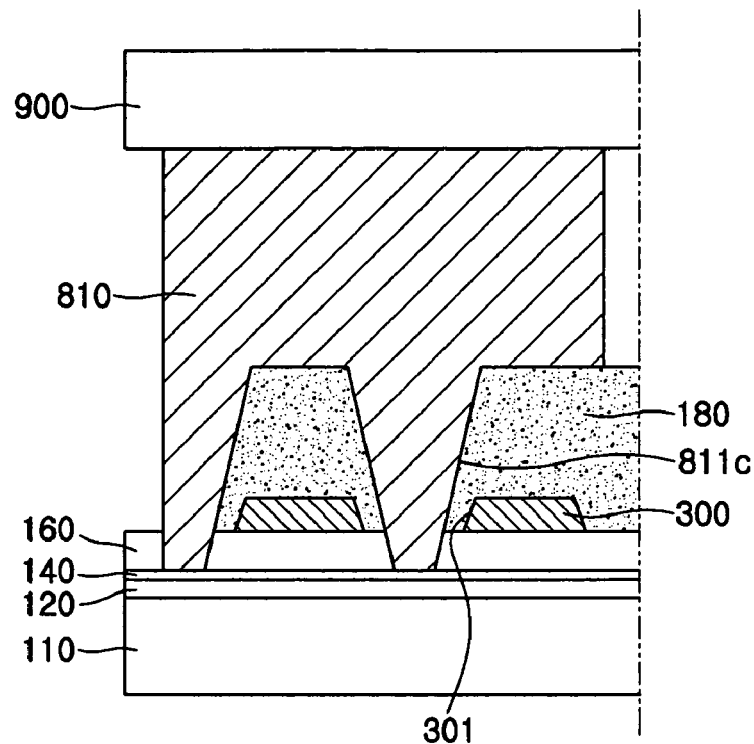
FIGS. 3A through 3C are schematic cross-sectional views of a sealing portion in a flat panel display according to another embodiment of the present invention.
Figure 3B:
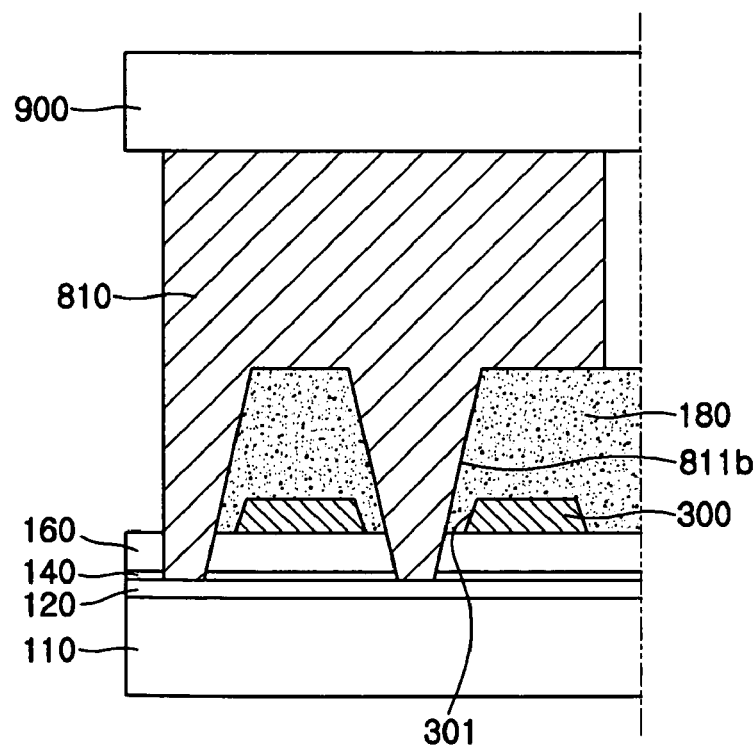
Figure 3C:
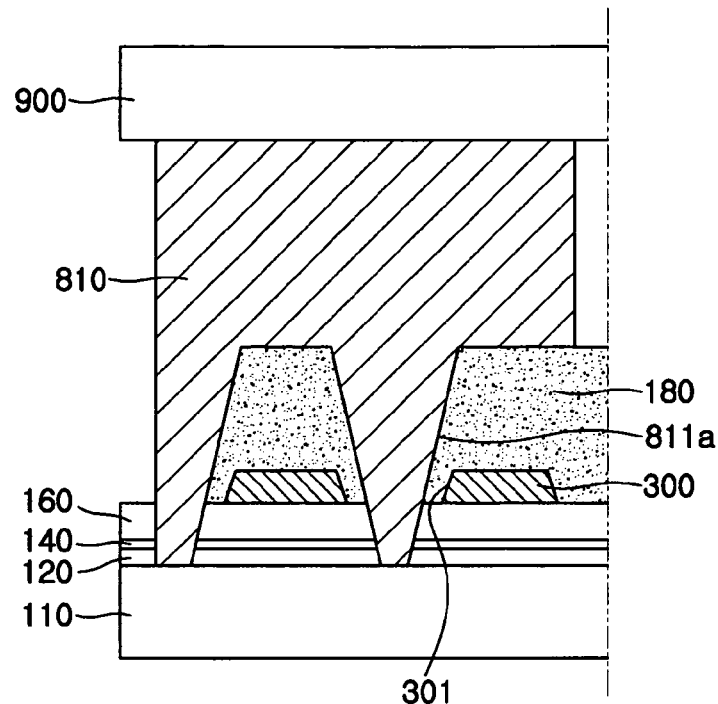

In FIG. 2B, the bottom of the via hole 811 contacts the interlayer 160. However, in FIGS. 3A and 3B, various modifications of the via hole 811 are shown. That is, as shown in FIG. 3A, when the layer formed of the same material as the source/drain electrodes 170 is used as the driving power supply line 300, the via hole 811c can be formed to penetrate the penetration hole 301 formed on the driving power supply line 300, and the interlayer 160, so that the bottom of the via hole 811 forms the gate insulation layer 140. In addition, as shown in FIG. 3B, the via hole 811b can penetrate the gate insulating layer 140 so that the bottom of the via hole 811b meets the buffer layer 120. Otherwise, as shown in FIG. 3C, the bottom of the via hole 811a can contact the surface of the substrate 110. When the depth of the via hole 811 is increased, the contact area with the sealing portion 810 increases and the adhesive strength between the substrate 110 and the encapsulation substrate 900 can be increased. However, if the substrate 110 is exposed, it can receive stress, and thus an appropriate depth of the via hole should be determined in consideration of design specifications. In the above embodiments, the via hole 811 penetrates the inorganic layer. However, alternative embodiments are possible. For example, the via hole 811 can be formed so as to not penetrate the interlayer 160 but only etch a part of the interlayer 160. In addition, as shown in FIGS. 4A-4C, the driving power supply line 300 can include one or more conductive layers.

Also, the penetration hole 301 in the driving power supply line 300 and the via hole 811 in the protection layer 180 can be simultaneously formed in the corner (A in FIGS. 2A and 5A). As described above, it is desirable for the cross-section of the penetration hole 301 to be smaller than that of the corresponding via hole 811. This structure of the penetration hole 301 and the via hole 811 can be modified in various ways.

Figure 5B:
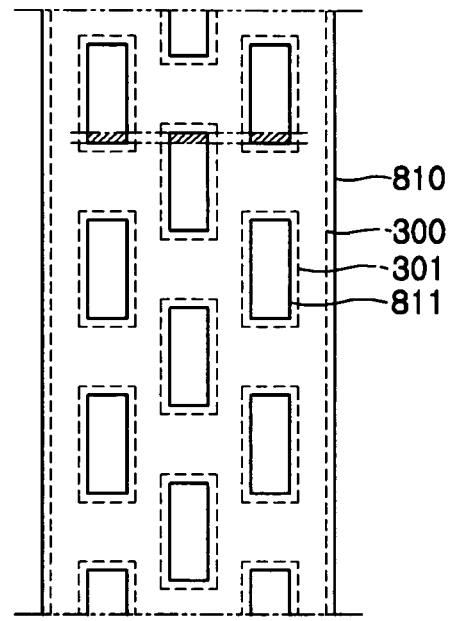
FIGS. 5B through 5E are schematic plan views of an edge of the sealing portion shown in FIG. 5A according to an embodiment of the present invention.
Figure 5C:
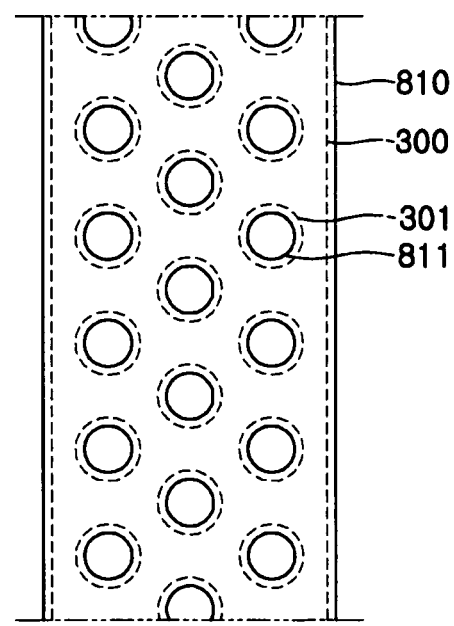
Figure 5D:
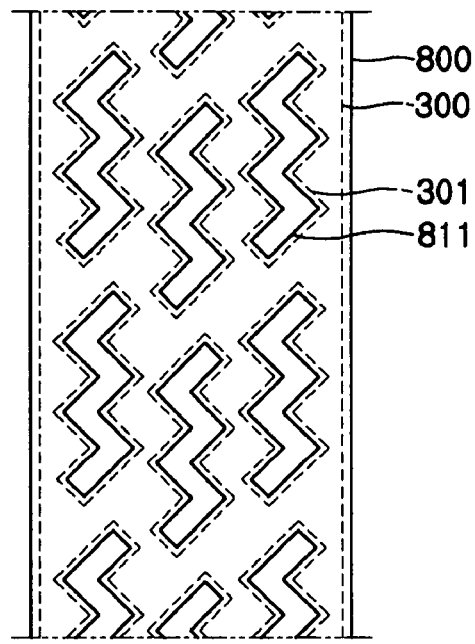
Figure 5E:
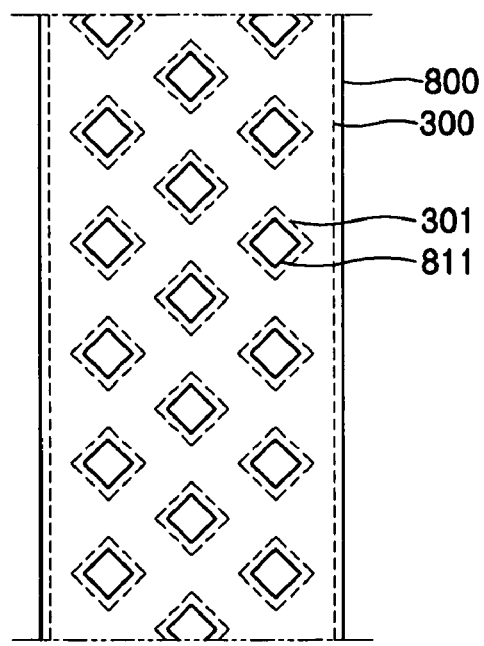

The penetration hole 301 formed in the driving power supply line 300 where it overlaps the edge portion (B in FIG. 2A) of the sealing portion, and the via hole 811 formed in the protection layer 180, can be formed in various shapes. That is, the penetration hole 301 and the via hole 811 can have square shapes as shown in FIG. 2A or circular or rhombic shapes as shown in FIGS. 5B and 5C. The penetration holes and the via holes are arranged regularly with a constant interval between neighboring penetration holes/via holes, thereby enabling easy manufacturing of the pattern. Also, in order to prevent moisture from infiltrating into the penetration hole and/or the via hole, at least a part of a certain penetration hole and/or via hole transversely overlaps a part of a neighboring penetration hole and/or via hole toward the display area 200. That is, as denoted by a hatched line in FIG. 5D, it is desirable for selected penetration holes and/or via holes to have overlapping portions with neighboring penetration holes/via holes. Thus, as shown in FIG. 5E, overlapping portions of large area between neighboring penetration holes and/or via holes can be formed in order to improve the function of preventing moisture from infiltrating the display device. When the penetration hole is formed in the driving power supply line, an appropriate type of penetration hole should be determined in consideration of problems in manufacturing, such as the voltage drop due to an increase in the penetration hole area, or due to a reduced distance between penetration holes.

The flat panel display device according to the present invention is not limited to above-described embodiments. Arrangements of lines such as the driving power supply line arranged at a peripheral portion of the display area, and layouts of elements such as the horizontal/vertical circuit driving units, can be modified in various ways. Also, while the above embodiments relate to an organic EL display, they can be applied to other types of flat panel displays, such as liquid crystal displays (LCDs).

According to the present invention, a part of the driving power supply line is located between the substrate and the sealant to increase the panel size.

In addition, one or more penetration holes are formed in the driving power supply line that crosses the sealing portion, thereby preventing or reducing damage to the sealing portion due to different thermal expansion rates when the sealing portion is cured.

In addition, in the flat panel display according to the present invention, one or more via holes are formed in the protection layer, which is preferably an organic protection layer, arranged on the driving power supply line, to make the sealing portion contact the inorganic layer under the organic protection layer through the via hole. This improves the seal and enhances protection against moisture infiltration.

Also, the driving power supply line includes one or more conductive layers to prevent the voltage from dropping.

The penetration hole and/or the via hole is formed to extend around the corner of the protection layer that overlaps with the driving power supply line and/or the sealant, thereby improving the seal at the corner.

The penetration hole and/or the via hole can be formed in various shapes in the edge portion of the protection layer where it overlaps with the driving power supply line and/or the sealant. Neighboring penetration holes and/or via holes can partially overlap with each other toward the display area, thereby further preventing moisture infiltration.

While the present invention has been particularly shown and described with reference to exemplary embodiments thereof, it will be understood by those of ordinary skill in the art that various changes in form and details can be made therein without departing from the spirit and scope of the present invention as recited by the following claims.

What is claimed is:

1. A display comprising:
    a display area displaying an image with display devices arranged on a substrate;
    a sealing portion sealing the display area with a sealant arranged along an outer edge portion of the display area; and
    a driving power supply line supplying a driving voltage to the display area;
    wherein the driving power supply line includes at least one conductive layer having at least a portion thereof arranged between the sealing portion and the substrate and at least one via hole arranged in a protection layer arranged on an upper surface of the driving power supply line contacting the sealant;
    wherein the at least one via hole extends so that a portion of the sealant closely contacts an upper surface of an inorganic layer under the protection layer; and
    wherein the conductive layer is arranged between the inorganic layer at the bottom of the at least one via hole and the protection layer.

2. The display of claim 1, wherein the protection layer comprises at least one organic layer.

3. The display of claim 1, wherein at least one penetration hole is arranged in the conductive layer.

4. The display of claim 3, wherein the conductive layer comprises a layer of the same material as that of source/drain electrodes on the display area.

5. The display of claim 1, wherein the inorganic layer at the bottom of the at least one via hole is of the same material as that of an interlayer on the display area.

6. The display of claim 1, wherein the inorganic layer at the bottom of the at least one via hole is of the same material as that of a gate insulating layer on the display area.

7. The display of claim 1, wherein the inorganic layer at the bottom of the at least one via hole is of the same material as that of a buffer layer on the display area.

8. The display of claim 1, wherein the bottom surface of the at least one via hole contacts a surface of the substrate.

9. The display of claim 1, wherein the display devices comprise organic electroluminescent devices.

10. A display comprising:
    a display area displaying an image with display devices arranged on a substrate;
    a sealing portion sealing the display area with a sealant arranged along an outer edge portion of the display area; and
    a driving power supply line supplying a driving voltage to the display area;
    wherein the driving power supply line includes at least one conductive layer having at least a portion thereof arranged between the sealing portion and the substrate and at least one via hole arranged in a protection layer arranged on an upper surface of the driving power supply line contacting the sealant;
    wherein the at least one via hole extends so that a portion of the sealant closely contacts an inorganic layer under the protection layer; and
    at least one penetration hole is arranged in the conductive layer;
    wherein the at least one penetration hole communicates with the at least one via hole; and wherein the conductive layer is arranged between the inorganic layer at the bottom of the at least one via hole and the protection layer.

11. A display comprising:

a display area displaying an image with display devices arranged on a substrate;

a sealing portion sealing the display area with a sealant arranged along an outer edge portion of the display area; and a driving power supply line supplying a driving voltage to the display area;

wherein the driving power supply line includes at least one conductive layer having at least a portion thereof arranged between the sealing portion and the substrate and at least one via hole arranged in a protection layer arranged on an upper surface of the driving power supply line contacting the sealant;

wherein the at least one via hole extends so that a portion of the sealant closely contacts an inorganic layer under the protection layer; and at least one penetration hole is arranged in the conductive layer; and wherein a cross-section of the at least one via hole is smaller than that of a communicating at least one penetration hole.

12. A display comprising:

a display area displaying an image with display devices arranged on a substrate;

a sealing portion sealing the display area with a sealant arranged along an outer edge portion of the display area; and a driving power supply line supplying a driving voltage to the display area;

wherein the driving power supply line includes at least one conductive layer having at least a portion thereof arranged between the sealing portion and the substrate and at least one via hole arranged in a protection layer arranged on an upper surface of the driving power supply line contacting the sealant;

wherein the at least one via hole extends so that a portion of the sealant closely contacts an inorganic layer under the protection layer; and at least one penetration hole is arranged in the conductive layer; and wherein the conductive layer arranged between the inorganic layer at the bottom of the at least one via hole and the protection layer comprises a layer of the same material as that of a gate electrode on the display area.

13. An organic electroluminescent display comprising:

a display area displaying an image with organic electroluminescent devices arranged on a substrate;

a sealing portion sealing at least the display area with a sealant arranged along an outer edge portion of the display area; and a driving power supply line supplying a driving voltage to the display area;

wherein the driving power supply line includes at least one conductive layer, at least a portion thereof being arranged between the sealing portion and the substrate and at least one via hole arranged in a protection layer arranged on an upper surface of the driving power supply line, wherein the at least one via hole is extended so that a portion of the sealant directly contacts an upper surface of an inorganic layer under the protection layer; and wherein the conductive layer is arranged between the inorganic layer at the bottom of the at least one via hole and the protection layer.

14. An organic electroluminescent display comprising:

a display area displaying an image with organic electroluminescent devices arranged on a substrate;

a sealing portion sealing at least the display area with a sealant arranged along an outer edge portion of the display area; and a driving power supply line supplying a driving voltage to the display area;

wherein the driving power supply line includes at least one conductive layer, a portion thereof being arranged between the sealing portion and the substrate and at least one via hole arranged in a protection layer arranged on an upper surface of the driving power supply line, and wherein the at least one via hole is extended so that a portion of the sealant directly contacts an upper surface of an inorganic layer under the protection layer;

wherein at least one penetration hole is arranged in the conductive layer arranged between the inorganic layer at the bottom of the at least one via hole and the protection layer; and wherein the conductive layer is arranged between the inorganic layer at the bottom of the at least one via hole and the protection layer.

15. A display comprising:

a display area displaying an image with display devices arranged on a substrate;

a sealing portion sealing the display area with a sealant arranged along an outer edge portion of the display area; and a driving power supply line supplying a driving voltage to the display area;

wherein the driving power supply line includes at least one conductive layer, a portion thereof being arranged between the sealing portion and the substrate and at least one via hole arranged in a protection layer arranged on top of the driving power supply line and extending so that a portion of the sealant directly contacts an upper surface of an inorganic layer under the protection layer through the at least one via hole;

wherein at least one via hole is arranged in the protection layer where it overlaps a corner of the sealing portion extending around a corner; and wherein the conductive layer is arranged between the inorganic layer at the bottom of the at least one via hole and the protection layer.

16. The display of claim 15, wherein the protection layer comprises at least one organic layer.

17. The display of claim 15, wherein the inorganic layer at the bottom of the at least one via hole in the corner portion is of the same material as that of an interlayer on the display area.

18. The display of claim 15, wherein the inorganic layer at the bottom of the at least one via hole in the corner portion is of the same material as that of a gate insulating layer on the display area.

19. The display of claim 15, wherein the inorganic layer at the bottom of the at least one via hole in the corner portion is of the same material as that of a buffer layer on the display area.

20. The display of claim 15, wherein the bottom of the at least one via hole in the corner contacts a surface of the substrate.

21. The display of claim 15, wherein the display devices comprise organic electroluminescent devices.

22. A display comprising:
a display area displaying an image with display devices arranged on a substrate;
a sealing portion sealing the display area with a sealant arranged along an outer edge portion of the display area; and
a driving power supply line supplying a driving voltage to the display area;
wherein the driving power supply line includes at least one conductive layer, a portion thereof being arranged between the sealing portion and the substrate and at least one via hole arranged in a protection layer arranged on top of the driving power supply line and extending so that a portion of the sealant directly contacts an inorganic layer under the protection layer through the at least one via hole;
wherein at least one via hole is arranged in the protection layer where it overlaps a corner of the sealing portion extending around a corner; and
wherein at least one penetration hole is arranged around the corner portion of the at least one conductive layer, the at least one conductive layer being arranged between the inorganic layer at the bottom of the at least one via hole and the protection layer.

23. The display of claim 22, wherein the at least one penetration hole in the corner portion of the at least one conductive layer communicates with the at least one via hole.

24. The display of claim 22, wherein a cross-section of the at least one via hole is smaller than that of a communicating at least one penetration hole.

25. A display comprising:
a display area displaying an image with display devices arranged on a substrate;
a sealing portion sealing the display area with a sealant arranged along an outer edge portion of the display area; and
a driving power supply line supplying a driving voltage to the display area;
wherein the driving power supply line includes at least one conductive layer, a portion thereof being arranged between the sealing portion and the substrate and at least one via hole arranged in a protection layer arranged on top of the driving power supply line and extending so that a portion of the sealant directly contacts an inorganic layer under the protection layer through the at least one via hole;
wherein at least one via hole is arranged in the protection layer where it overlaps a corner of the sealing portion extending around a corner; and
wherein the at least one conductive layer is arranged between the inorganic layer at the bottom of the at least one via hole and the protection layer and includes a layer of the same material as that of source/drain electrodes on the display area.

26. A display comprising:
a display area displaying an image with display devices arranged on a substrate;
a sealing portion sealing the display area with a sealant arranged along an outer edge portion of the display area; and
a driving power supply line supplying a driving voltage to the display area;
wherein the driving power supply line includes at least one conductive layer, a portion thereof being arranged between the sealing portion and the substrate and at least one via hole arranged in a protection layer arranged on top of the driving power supply line and extending so that a portion of the sealant directly contacts an inorganic layer under the protection layer through the at least one via hole;
wherein at least one via hole is arranged in the protection layer where it overlaps a corner of the sealing portion extending around a corner; and
wherein the at least one conductive layer is arranged between the inorganic layer at the bottom of the at least one via hole and the protection layer and includes a layer of the same material as that of a gate electrode on the display area.

27. A display comprising:
a display area displaying an image with display devices arranged on a substrate;
a sealing portion sealing the display area with a sealing material arranged along an outer edge portion of the display area; and
a driving power supply line supplying a driving voltage to the display area;
wherein the driving power supply line includes at least one conductive layer, a portion thereof being arranged between the sealing portion and the substrate and at least one via hole arranged in a protection layer arranged on a top of the driving power supply line and extending so that at least a portion of the sealing material directly contacts an upper surface of an inorganic layer under the protection layer through the at least one via hole;
wherein at least one via hole is arranged in the protection layer where it overlaps the sealing portion transversely with a portion of a neighboring via hole arranged toward the display area; and
wherein the conductive layer is arranged between the inorganic layer at the bottom of the at least one via hole and the protection layer.

28. A display comprising:
a display area displaying an image with display devices arranged on a substrate;
a sealing portion sealing the display area with a sealing material arranged along an outer edge portion of the display area; and
a driving power supply line supplying a driving voltage to the display area;
wherein the driving power supply line includes at least one conductive layer, a portion thereof being arranged between the sealing portion and the substrate and at least one via hole arranged in a protection layer arranged on a top of the driving power supply line and extending so that at least a portion of the sealing material directly contacts an inorganic layer under the protection layer through the at least one via hole;
wherein at least one via hole is arranged in the protection layer where it overlaps the sealing portion transversely with a portion of a neighboring via hole arranged toward the display area; and
wherein at least one penetration hole is arranged to communicate with the at least one via hole in a conductive layer, the conductive layer being arranged between the inorganic layer at the bottom of the at least one via hole, and the protection layer.

* * * * *